United States Patent [19]
Getgen

[11] 3,943,454
[45] Mar. 9, 1976

[54] DIGITAL LOGIC CIRCUITS FOR PRODUCING DIGITAL SUM AND DIFFERENCE FREQUENCIES

[75] Inventor: Lawrence E. Getgen, Redwood City, Calif.

[73] Assignee: GTE Automatic Electric Laboratories Incorporated, Northlake, Ill.

[22] Filed: Feb. 19, 1974

[21] Appl. No.: 443,569

[52] U.S. Cl. ............. 328/133; 235/150.3; 307/215; 328/157; 328/160
[51] Int. Cl.² ... G06G 7/16; H03K 5/20; H03K 7/06
[58] Field of Search ................... 321/60, 61, 65, 66; 328/134, 156, 157, 158, 104, 133, 159, 160; 307/261, 243, 295, 215; 332/9 R, 9 T; 235/150.3

[56] References Cited
UNITED STATES PATENTS

| | | |
|---|---|---|
| 2,848,616 | 8/1958 | Tollefson ....................... 328/156 X |
| 3,309,601 | 3/1967 | Dudley ............................ 307/261 X |
| 3,337,814 | 8/1967 | Brase et al. ..................... 328/134 X |
| 3,671,876 | 6/1972 | Oshiro .............................. 328/134 |

*Primary Examiner*—Siegfried H. Grimm
*Attorney, Agent, or Firm*—Leonard R. Cool; Russell A. Cannon

[57] ABSTRACT

The present invention provides means for deriving a single frequency signal from logic signals A(t) and B(t) by first applying the logic signals to a combining arrangement, which includes logic circuits and can be built using only standard integrated circuit components, e.g., flip-flops, gates, and amplifiers. The output of the combining means is the sum and difference frequencies, in digital form, of the logic signals A(t) and B(t). The single frequency is selected from the frequencies present at the output of the combining means.

22 Claims, 6 Drawing Figures

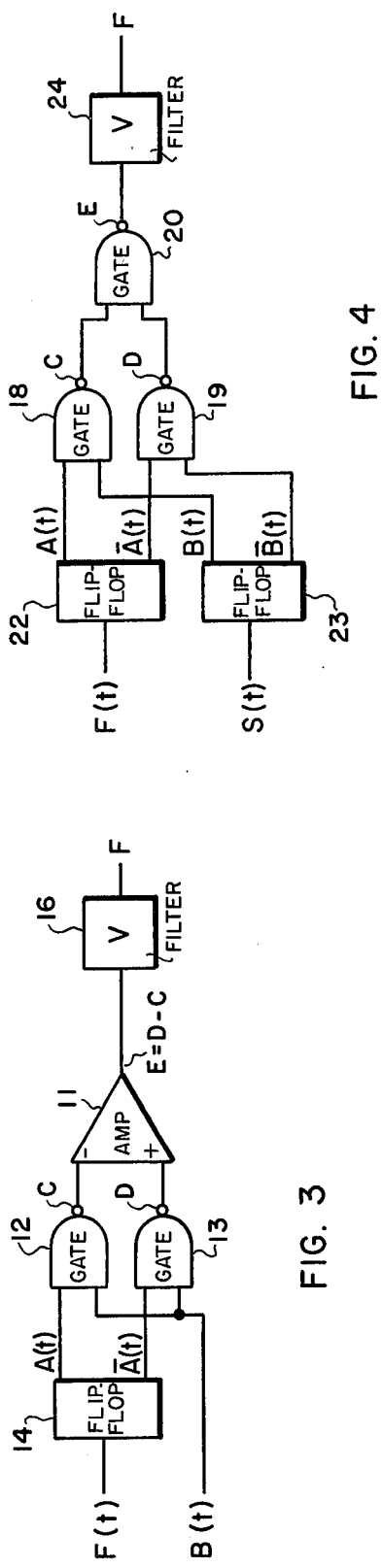
FIG. 3
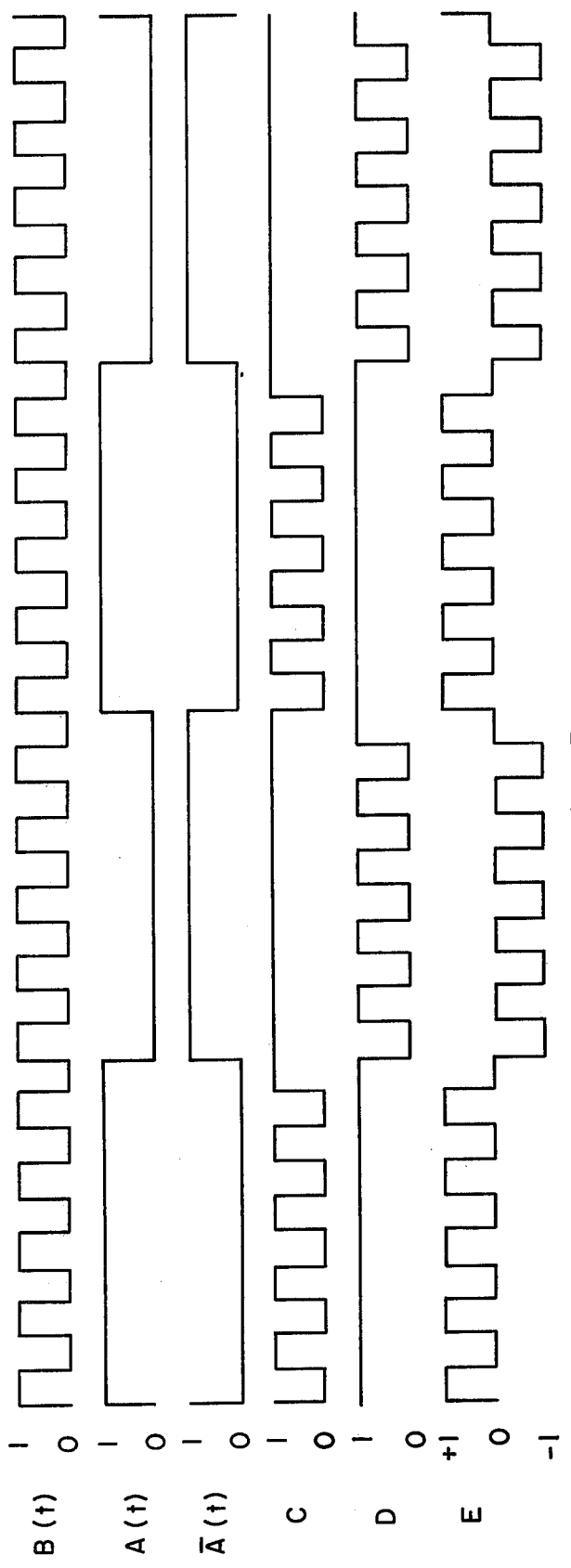
FIG. 4
FIG. 5

DIGITAL LOGIC CIRCUITS FOR PRODUCING DIGITAL SUM AND DIFFERENCE FREQUENCIES

BACKGROUND OF THE INVENTION

1. Field of Invention

The invention relates to techniques used for generating or deriving single frequency signals as may be required in communication systems, as for example for pilot carrier frequencies, signaling tones, and the like; and more particularly to means and methods by which such signals may be derived from available logic signals of different frequencies.

2. Description of Prior Art

Heretofore, single frequency signals of the character described have been obtained by subdividing the frequency of a clock source, as by means of a counter, or by modulation wherein a beat signal is obtained having a frequency equal to the sum or difference of the frequencies of the two more basic signals used in the modulation process. The frequency division technique may be used only where the frequency division requirement corresponds with an available counter division ratio. Thus, given say a 720 kHz clock source, an 8 kHz signal may be obtained by using a divide-by-90 counter. On the other hand, if there was available in the system say a 160 kHz signal and a 72 kHz signal was required, derivation of the latter by a division technique is not feasible. However, if in the same system an 8 kHz signal is available, the 160 kHz signal may be reduced to an 80 kHz signal by a divide-by-2 counter and then modulated with the 8 kHz signal to produce the required 72 kHz signal.

The usual method for obtaining the product $P(t) = \sin 2\pi(f_m \pm f_n)t$ is accomplished by the well-known process of modulation wherein the frequency of a single frequency wave (normally called the carrier wave) is varied in step with the instantaneous value of a second signal, called the modulating wave. The signals to be modulated $A(t) = \sin 2\pi f_m t$ and $B(t) = \sin \pi 2 f_n t$ may be either sine waves as indicated or square waves. These are fed into a modulator usually made up of diodes and/or transistors and quite often transformers; and a filter is placed at the output of the modulator to select the desired output signal $\sin 2\pi(f_m + f_n)$ or $\sin 2\pi(f_m - f_n)t$. In equipment which uses mainly integrated digital logic circuits it is advantageous to use standard logic circuits whenever possible and to minimize the use of the discrete, analog components such as required by the usual modulator.

SUMMARY OF INVENTION

The present invention provides means for deriving a single frequency signal from logic signals $A(t)$ and $B(t)$ by first applying the logic signals to a combining arrangement, which includes logic circuits and can be built using only standard integrated circuit components, e.g., flip-flops, gates, and amplifiers. The output of the combining means is the sum and difference frequencies, in digital form, of the logic signals $A(t)$ and $B(t)$. The single frequency is selected from the frequencies present at the output of the combining means. Briefly then, the present invention may be used to generate a signal having a frequency $f_c$ which is the sum or difference of the frequencies $f_a$ and $f_b$ of signals available in logic level form. In this sense, the present invention differs from modulators in general in that the means and method of the present invention is used to provide a signal of single frequency.

The invention possesses other objects and features of advantage, some of which of the foregoing will be set forth in the following description of the preferred form of the invention which is illustrated in the drawings accompanying and forming part of this specification. It is to be understood, however, that variations in the showing made by the said drawings and description may be adopted within the scope of the invention as set forth in the claims.

BRIEF DESCRIPTION OF THE DRAWINGS

Referring to said drawings:

FIG. 3 is a schematic diagram of a signal derivation means constructed in accordance with the present invention.

FIG. 4 is a schematic diagram of a modified form of the invention.

FIG. 5 is a graph showing signal waveforms involved in the structure of FIG. 3.

DETAILED DESCRIPTION OF INVENTION

Figure 1:
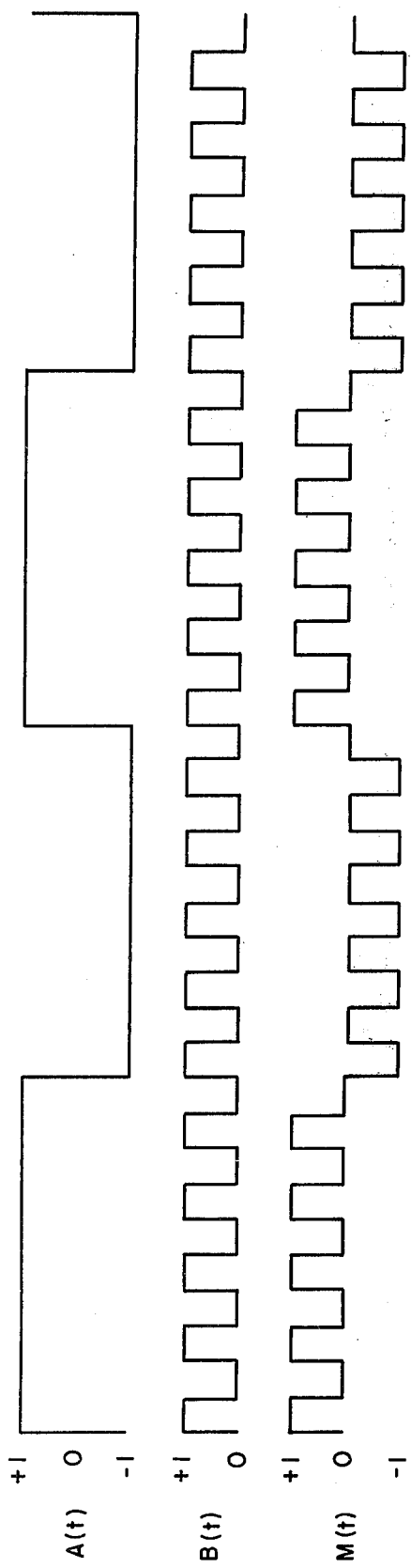
FIG. 1 is a graph of ideal waveforms in a modulation process using a unipolar carrier signal.

Typical modulation waveforms using a unipolar carrier signal $B(t)$ are illustrated in FIG. 1 wherein it may be seen that the modulated product $M(t)$ is of the commonly understood form which may be expressed: $M(t) = A(t) \cdot B(t)$.

Figure 2:
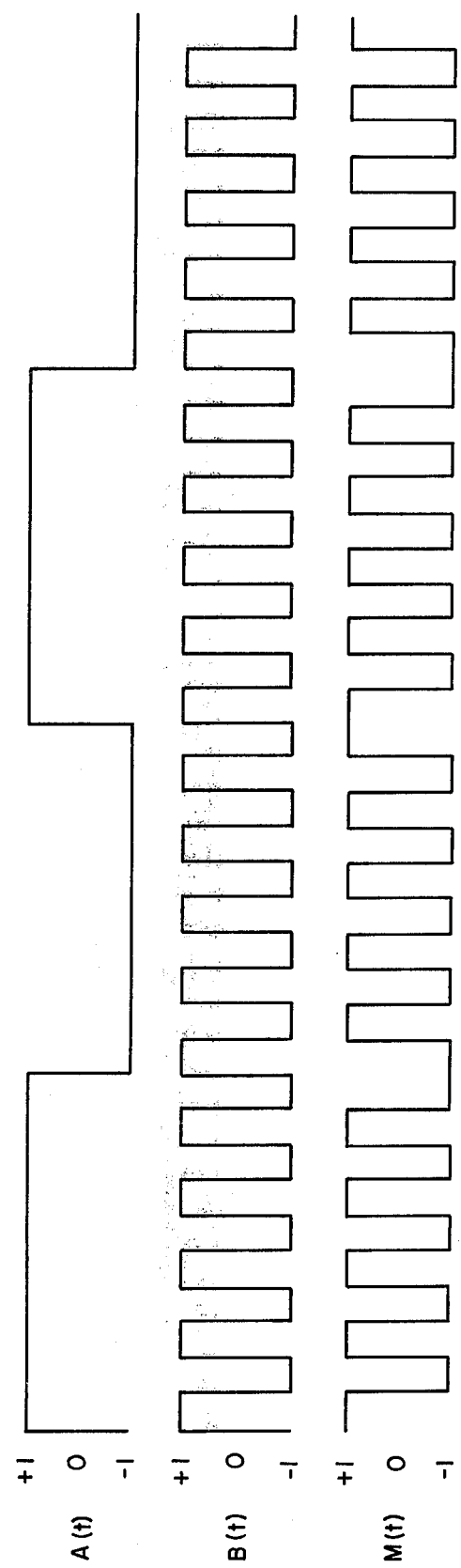
FIG. 2 is a graph of ideal waveforms in a modulation process using a bipolar carrier signal.

In a similar manner, ideal waveforms involved in a modulation process of signals $A(t)$ and $B(t)$, wherein $B(t)$ is a bipolar signal, are shown in FIG. 2. As will be observed, the modulation signal $M(t) = A(t) \cdot B(t)$.

The object of the present invention is to provide the aforementioned modulation signals $M(t)$ not by the usual modulator but by the use of integrated circuit components as illustrated in FIGS. 3 and 4. The method of the present invention for obtaining a signal $M(t)$ having a frequency equal to the sum or difference of a pair of logic signals $A(t)$ and $B(t)$ here consists briefly in the combining of logic signals $A(t)$ and $B(t)$ in a plurality of coincidence circuits wherein each coincidence circuit produces one specified output condition only when the input logic signals are of one like state and produces the other output condition for all other combinations of the logic signals. The appearance of logic signals $A(t)$ and $B(t)$ must naturally occur during an assigned time interval which interval is established by a conventional clock signal, not shown.

One circuit arrangement for practising the general method is shown in FIG. 3 which may be used with a unipolar, i.e., binary, logic (carrier) signal $B(t)$. A pair of logic signals, modulation signal $A(t)$ and carrier signal $B(t)$, are applied directly to the inputs of the first of a pair of coincidence circuits. The first coincidence circuit has a logic 1 output except when the true form of logic signals $A(t)$ and $B(t)$ are both logic 1 during any particular assigned time interval. The second coincidence circuit has inputs of the true form of the carrier signal $B(t)$ and the complement of the modulating signal $A(t)$, i.e., $\overline{A}(t)$. As shown in FIG. 3, the second coincidence circuit has a 1 output except when both inputs, i.e., $\overline{A}(t)$ and $B(t)$, are both logic 1 during any assigned time interval. The outputs of the two coincidence circuits are then summed. The summing operation is here shown accomplished in FIG. 3 by the use of a summing amplifier 11 having plus and minus inputs connected to outputs C and D of the respective first and second coincidence circuits, as shown. The amplifier 11 output at E is equal to the input differences, i.e., D input minus C input. As will be demonstrated, output E contains the desired modulation signal $M(t) = A(t) \cdot B(t)$. A narrow-band filter 16 selects the sum or difference frequency from the signals present at E so that the desired single frequency signal is available at F.

The aforementioned coincidence circuits here comprise simple NAND gates 12 and 13 which provide selective outputs C and D in accordance with the following truth table:

| A(t) | B(t) | C |
|------|------|---|
| 0 | 0 | 1 |
| 0 | 1 | 1 |
| 1 | 0 | 1 |
| 1 | 1 | 0 |

Gate 13 functions in an identical manner to selectively provide output D for various inputs of $\overline{A}(t)$ and B(t) as shown in the truth table. In FIG. 3 the signal A(t) and its complement $\overline{A}(t)$ are shown originating from a flip-flop 14. This is a convenient way of obtaining the true and complementary waveforms if a source voltage F(t) is available having a frequency of two times the frequency of signal A(t). However, if signal A(t) is directly available, $\overline{A}(t)$ can be obtained by running signal A(t) through an inverter. The essential thing insofar as the present invention is concerned is to provide the true and complement forms of one of the pair of signals to be modulated. The flip-flop 14 does this but also acts as a frequency divider. As will be seen from FIG. 3, signals A(t) and $\overline{A}(t)$ are applied to the inputs of NAND gates 12 and 13 as is also the second (carrier) signal B(t); and the outputs C and D of the NAND gates 12 and 13 are connected to the minus and plus inputs of summing amplifier 11. A filter 16 is connected to the output of amplifier 11 to pick off the desired modulation product.

The operation of the apparatus of FIG. 3 may be better understood by reference to the waveforms illustrated in FIG. 5. The top three waveforms show the basic wave trains B(t), A(t), and $\overline{A}(t)$. The wave train depicted at C corresponds with the output C of NAND gate 12 and results from the NANDING of signals A(t) and B(t). The wave train depicted at D corresponds with the output of NAND gate 13 and results from the NANDING of signals $\overline{A}(t)$ and B(t). The wave train depicted at E corresponds with the output of amplifier 11 and is the result of summing the waveforms shown at C and D. Most importantly, it will be noted that the wave train shown at E corresponds with the wave train M(t) of FIG. 1 and hence the desired modulation has been accomplished using integrated circuit components rather than the usual modulator.

A modification of the circuitry is illustrated in FIG. 4 for obtaining modulation of signal A(t) by bipolar signal B(t) as shown in FIG. 2. In this case the true and complementary forms of both signals are used. As shown in FIG. 4, the true signals $\overline{A}$(t) and $\overline{B}$(t) are connected to a first coincidence circuit 18 providing an output C having a logical 1 in all cases except when both of the signals applied thereto are logical 1. Similarly, the complementary signals $\overline{A}$(t) and $\overline{B}$(t) are connected to a second coincidence circuit 19 providing an output D having a logical 1 in all cases except when both of the input signals are a logical 1. Outputs C and D are then connected to a third coincidence circuit 20 having an output E again providing an output having a logical 1 in all cases except when outputs C and D are a logical 1. Coincidence circuits 18, 19, and 20 may comprise simple NAND gates providing a selective output in accordance with the truth table hereinabove set forth. The true and complementary forms of signals A(t) and B(t) may be obtained as here shown from a pair of flip-flops 22 and 23 as in the first described embodiment where signals F(t) and S(t) are available having frequencies of two times the frequencies of A(t) and B(t), respectively. A filter 24 is connected to output E of NAND gate 20 for picking off the desired modulation product.

Figure 6:
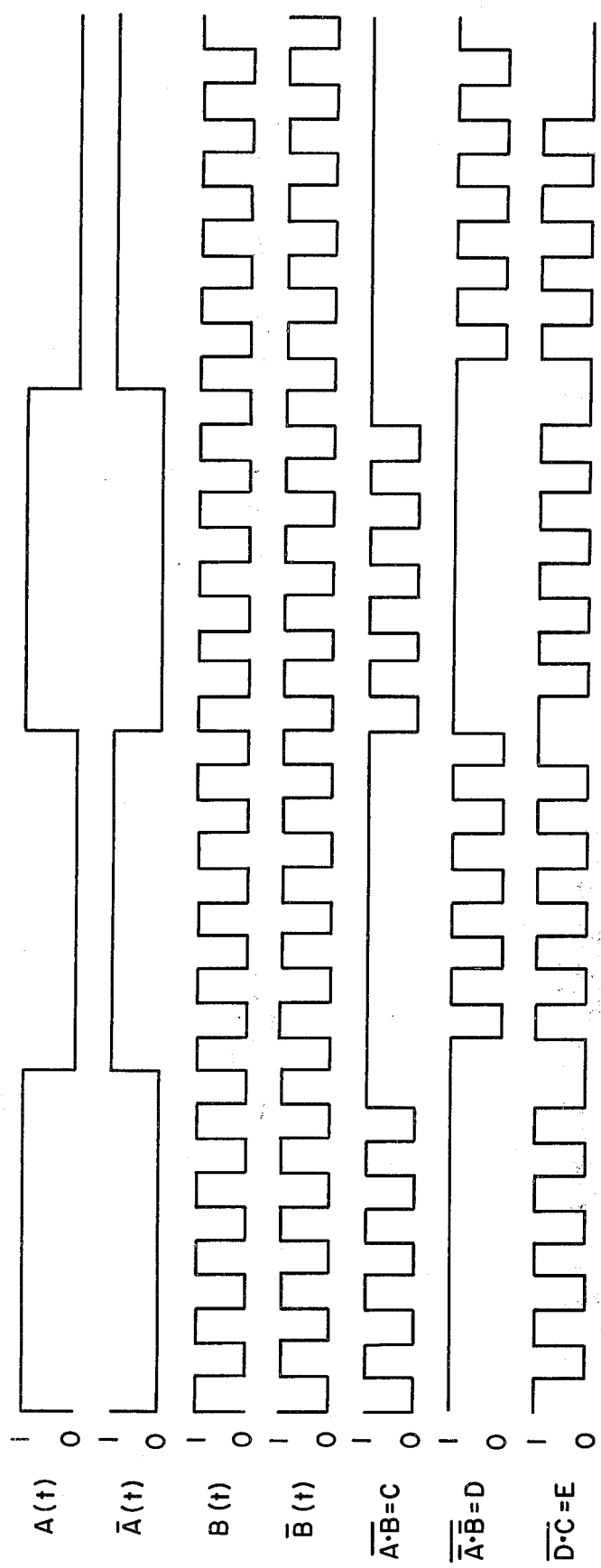
FIG. 6 is a graph showing signal waveforms involved in the structure of FIG. 4.

The operation of the circuit of FIG. 4 may be better understood with reference to the waveforms shown in FIG. 6. The true and complementary forms of signals A(t) and B(t) are the waveforms shown on the first four lines of the FIGURE. The wave train depicted at C corresponds with the output C of NAND gate 18 and results from the NANDING of signals A(t) and B(t). The wave train as depicted at D corresponds with the output D of NAND gate 19 and results from the NANDING of signals $\overline{A}(t)$ and $\overline{B}(t)$. The wave train depicted at E corresponds with the output E of NAND gate 20 and results from the NANDING of outputs C and D. Most importantly, it will be noted that the waveform shown at E is the same as that shown at M(t) of FIG. 2 thus demonstrating the successful modulation of a bipolar carrier signal by use of integrated circuit components rather than the conventional modulator. There is a DC offset which is immaterial to the circuit application and has no consequence after the signal passes through filter 24.

What is claimed is:

1. Apparatus for obtaining a signal having a frequency component equal to the algebraic sum of the fundamental frequencies of a pair of logic signals, A(t) and B(t), comprising:
   means for deriving the complement of the true form of at least one of said pair of logic signals, whereby true and complementary forms of the signal are available;
   combining means, including means for logically combining in selected pairs true and complementary forms of said pair of logic signals, the combining means providing at its output the sum and difference of the fundamental frequencies of said logic signals in digital form; and
   selecting means having an output, and having an input connected to the output of the combining means, said selecting means providing at its output either the sum or the difference frequency.

2. Apparatus as in claim 1 wherein the combining means further comprises:
   a first coincidence circuit having an output, a first input operatively connected to receive the true form of the first logic signal, a second input operatively connected to receive the true form of the second logic signal, the first coincidence circuit providing an output signal of one binary state when the input logic signals are both of one like state and providing an output signal of the other binary state for all other combinations of logic signals;

a second coincidence circuit having an output, a first input operatively connected to receive the complementary form of the first logic signal, a second input operatively connected to receive the true form of the second logic signal, the second coincidence circuit providing an output signal of one binary state when the respective complementary and true form of the logic signals are both of one like state and providing an output of the other binary state for all other combinations of the logic signals;

and means for summing the output signals from said first and second coincidence circuits.

3. Apparatus as in claim 2 wherein the summing means is a differential amplifier.

4. Apparatus as in claim 3 wherein the first and second coincidence circuits are NAND gates.

5. Apparatus as in claim 4 wherein said selecting means is a bandpass filter.

6. Apparatus as in claim 1 wherein the combining means further comprises:

a first coincidence circuit having an output, and first and second inputs operatively connected to receive the true form, respectively, of the first and second logic signals; and providing an output signal of one binary state when the first and second input logic signals are both of one like state, and providing an output signal of the other binary state for all other combinations of the input logic signals;

a second coincidence circuit having an output, and first and second inputs operatively connected to receive the complementary form, respectively, of the first and second logic signals; and providing an output signal of one binary state when the first and second input logic signals are both of one like state, and providing an output signal of the other binary state for all other combinations of the input logic signals; and, a third coincidence circuit having an output, and a pair of inputs, a first input is operatively connected to the output of said first coincidence circuit, and a second input is connected to the output of the second coincidence circuit; and providing an output when the first and second inputs are of one like state and no output for all other combinations of inputs to the third coincidence circuit.

7. Apparatus as in claim 6 wherein the selecting means is a bandpass filter.

8. Apparatus as in claim 7 wherein said first, second, and third coincidence circuits are each a NAND gate.

9. A method for obtaining a frequency equal to the sum or difference frequency of a pair of logic signals, $A(t)$ and $B(t)$, consisting of the steps of:

deriving the complement of the true form of at least one of the pair of logic signals;

combining selected pairs of the true and complementary forms of said pairs of logic signals to obtain the sum and difference frequencies in digital form; and selecting the sum or difference frequency.

10. A method as defined in claim 9 wherein one of said pair of logic signals is unipolar and the other said logic signal is bipolar.

11. A method as defined in claim 10 wherein the step of combining further comprises:

combining the true form of a first of said pair of logic signals with the true form of a second of said pair in a first coincidence circuit providing an output of one binary state when the input logic signals are both of one like state and providing an output of the other binary state for all other combinations of the logic signals;

combining the complementary form of said first logic signal with the true form of said second of the pair in a second coincidence circuit providing an output of one binary state when the input logic signals are both of one like state and providing an output of the other binary state for all other combinations of the logic signals; and, summing said first and second outputs to obtain the sum and difference frequency in digital form.

12. A method as defined in claim 9 wherein each of said logic signals is bipolar.

13. A method as defined in claim 12 wherein the step of combining further comprises:

combining the true form of $A(t)$ and $B(t)$ so as to obtain a first binary output, the first output being of one binary state when the true form of $A(t)$ and $B(t)$ is of one like state and the first output being of the other binary state for all other combinations of $A(t)$ and $B(t)$;

combining the complementary form of $A(t)$ and $B(t)$ so as to obtain a second binary output, the second output being of one binary state when the complementary form of $A(t)$ and $B(t)$ is of one like state and the second output being of the other binary state for all other combinations of $A(t)$ and $B(t)$; and, combining the first and second binary outputs so as to obtain a third output in digital form which contains the sum and difference frequencies by providing an output when the first and second binary outputs are of one like state and producing no output for all other combinations of the first and second binary outputs.

14. Apparatus for obtaining a signal having a frequency equal to the algebraic sum of a pair of logic signals comprising:

means for obtaining the true and complementary forms of one of said signals, a first logic circuit having an input connected to receive the true form of said one signal and having another input connected to receive the other of said pair of signals, and providing an output having a logical 1 in all cases except when said true form and said other signal are both a logical 1;

a second logic circuit having an input connected to receive said complementary form signal and having another input connected to receive said other signal and providing an output having a logical 1 in all cases except when said complementary and said other signal are both a logical 1; and, means summing said outputs.

15. Apparatus as defined in claim 14 wherein said second signal is unipolar.

16. Apparatus as defined in claim 15 wherein said first and second logic circuits are NAND gates.

17. Apparatus as defined in claim 16 wherein said first named means comprises a flip-flop.

18. Apparatus as defined in claim 17 wherein said second named means is a summing amplifier.

19. Apparatus for obtaining the product of a pair of first and second signals alternating between bipolar logic levels comprising:

means for obtaining the true and complementary forms of said first and second signals;

a first logic circuit connected to said true forms of said first and second signals and providing a first output having a logical 1 in all cases except when said true form signals are a logical 1;

a second logic circuit connected to said complementary forms of said first and second signals and providing a second output having a logical 1 in all cases except when said complementary signals are a logical 1; and, a third logic circuit connected to said first and second outputs and providing an output having a logical 1 in all cases except when said first and second outputs are a logical 1.

20. Apparatus as defined in claim 19, and a filter connected to the output of said last named logic circuit.

21. Apparatus as defined in claim 19 wherein said logic circuits are NAND gates.

22. Apparatus as defined in claim 21 wherein said means for obtaining comprises a pair of flip-flops having inputs connected to said first and second signals.

* * * * *

UNITED STATES PATENT AND TRADEMARK OFFICE
CERTIFICATE OF CORRECTION

PATENT NO. : 3,943,454
DATED : March 9, 1976
INVENTOR(S) : Lawrence E. Getgen

It is certified that error appears in the above-identified patent and that said Letters Patent are hereby corrected as shown below:

Column 2, line 34, " = A(t) . B(t)" should read -- =A(t) $\cdot$ B(t) --;
same column 2, line 38, " = A(t) . B(t)" should read -- = A(t) $\cdot$ B(t) --.
Column 3, line 9/10, " = A(t) . B(t)" should read -- = A(t) $\cdot$ B(t) --;
same column 3, line 39, (second occurrence), "A(t)" should read
-- $\overline{A}$(t) --;
same column 3, line 66, "$\overline{A}$(t) and $\overline{B}$(t)" should read -- A(t) and B(t) --.
Column 4, line 2, "A(t) and B(t)" should read -- $\overline{A}$(t) and $\overline{B}$(t) --.

Signed and Sealed this twenty-ninth Day of June 1976

[SEAL]

Attest:

RUTH C. MASON
*Attesting Officer*

C. MARSHALL DANN
*Commissioner of Patents and Trademarks*